United States Patent
Narasimhan et al.

(10) Patent No.: US 10,446,196 B1
(45) Date of Patent: Oct. 15, 2019

(54) FLEXIBLE POWER SEQUENCING FOR DUAL-POWER MEMORY

(71) Applicant: QUALCOMM Incorporated, San Diego, CA (US)

(72) Inventors: Mukund Narasimhan, Bangalore (IN); Sharad Kumar Gupta, Bagalore (IN); Adithya Bhaskaran, Chennai (IN); Sei Seung Yoon, Santa Clara, CA (US)

(73) Assignee: Qualcomm Incorporated, San Diego, CA (US)

( * ) Notice: Subject to any disclaimer, the term of this patent is extended or adjusted under 35 U.S.C. 154(b) by 0 days.

(21) Appl. No.: 16/164,108

(22) Filed: Oct. 18, 2018

(51) Int. Cl.
*G11C 5/14* (2006.01)
*G11C 11/417* (2006.01)

(52) U.S. Cl.
CPC ............ *G11C 5/147* (2013.01); *G11C 11/417* (2013.01)

(58) Field of Classification Search
CPC ......... G11C 5/14; G11C 11/413; G11C 5/147; G11C 5/144
See application file for complete search history.

(56) References Cited

U.S. PATENT DOCUMENTS

| 8,635,572 | B1 | 1/2014 | Jin et al. |
| 8,724,421 | B2* | 5/2014 | Evans ................. G06F 1/10 365/226 |
| 9,001,572 | B2 | 4/2015 | Choi et al. |
| 9,171,610 | B2 | 10/2015 | Choi |
| 9,508,405 | B2 | 11/2016 | Jain et al. |
| 9,977,480 | B2 | 5/2018 | Kolla et al. |
| 2013/0135946 | A1* | 5/2013 | Katoch ............ G11C 11/4074 365/189.11 |
| 2017/0110164 | A1* | 4/2017 | Cheng ................ G11C 11/413 |
| 2018/0174643 | A1* | 6/2018 | Cheng ................ G11C 11/417 |

* cited by examiner

*Primary Examiner* — Tuan T Nguyen
(74) *Attorney, Agent, or Firm* — Haynes and Boone, LLP

(57) ABSTRACT

A dual-power-domain SRAM is disclosed in which the dual power domains may be powered up or down in whatever order is desired. For example, a (CX) power domain may be powered up first, followed by a memory (MX) power domain. Conversely, the MX power domain may be powered up prior to the CX domain.

20 Claims, 6 Drawing Sheets

FLEXIBLE POWER SEQUENCING FOR DUAL-POWER MEMORY

TECHNICAL FIELD

This application relates to dual-power memory, and more particularly to a flexible power sequencing for a dual-power memory.

BACKGROUND

A dual-power supply memory has two power domains: a memory power domain powered by a memory power supply voltage and a core power domain powered by a core power supply voltage. If the dual-power memory is embedded into a system-on-a-chip (SoC), the core power supply voltage may also be shared by a processor core within the SoC. In general, a memory requires various peripheral digital circuits such as address decoders, clocks, and write drivers in addition to the bitcells. The memory power domain thus includes not only the bitcells but portions of the peripheral digital circuits. The core power domain includes the remainder of the peripheral digital circuits (which may also be denoted as peripheral logic) for the dual-power memory.

The inclusion of two separate power domains in a dual-power memory increases efficiency by enabling a retention sleep mode and a non-retention sleep mode. In the retention sleep mode, the peripheral logic in both power domains shuts down but the bitcells remain powered so that they can retain their stored data. In the non-retention sleep mode, even the bitcells are powered down such that there is no retention of any stored data. The retention sleep mode advantageously preserves power by cutting off leakage losses in the peripheral logic during a quiescent period for the dual-power memory while still retaining the stored data.

Although dual-power memories are thus advantageously low-power, the separate power domains require a fixed sequencing during power up and power down. For example, it may be the memory power domain that is always powered on first (and thus powered-down last). An example conventional dual-power memory 100 with such a fixed power-on sequencing is shown in FIG. 1 that includes a memory power (MX) domain 105 powered by a memory power supply voltage VDDMX and a core power (CX) domain 110 powered by a core power supply voltage VDDCX. MX power domain 105 includes a plurality of bitcells 115 and also MX peripheral logic 120 whereas CX power domain 110 includes CX peripheral logic 160. While MX power domain 105 is being powered-up, an MX clamp signal is asserted that functions to isolate MX peripheral logic 120 from the memory power supply voltage VDDMX by switching off a head switch such as a p-type metal-oxide semiconductor (PMOS) transistor P1. Once dual-power memory 100 is fully powered on and in a normal operating mode, it may exit normal operation by entering the sleep retention mode responsive to an assertion of a sleep retention signal in CX power domain 110. During the sleep retention mode, head switch transistor P1 is shut off to isolate MX peripheral logic 120. Similarly, CX peripheral logic 160 is also isolated from the core power supply voltage VDDCX during the sleep retention mode by a switching off of a head switch such as a PMOS transistor P3.

To enable head switch transistors P1 and P3 to switch off responsive to an assertion of either the MX clamp signal or the sleep retention signal, the sleep retention signal is level-shifted through a level-shifter (LS) 135 and mixed with the MX clamp signal in an MX domain NOR gate 125. The output of NOR gate 125 will thus go low when either the MX clamp signal or the sleep retention signal is asserted. The output of NOR gate 125 is level shifted through a level-shifter 135 in CX power domain 150 and then inverted by an inverter 150 to drive head switch transistor P3, which will thus switch off responsive to either an assertion of the MX clamp signal or the sleep retention signal. The output of NOR gate 125 is also inverted through an MX domain inverter 130 to drive the gate of head switch transistor P1. MX peripheral logic 120 will thus be isolated from the memory power supply voltage when either the MX clamp signal or the sleep retention signal is asserted.

An assertion of a sleep non-retention signal in CX power domain 110 controls whether the sleep non-retention mode is active. The sleep non-retention signal is level-shifted through a level-shifter 130 to drive the gate of a PMOS head switch transistor P2 to cutoff bitcells 115 from the memory power supply voltage VDDMX. But during the assertion of the MX clamp signal, it is desired that the current state of head switch transistor P2 be maintained so that level-shifter 130 also functions as a latch. To prevent the sleep non-retention signal from affecting the state of the latch, the assertion of the MX clamp signal functions to isolate the sleep non-retention signal from level-shifter/latch 130 through a logic circuit 130.

Dual-power memory 100 works adequately so long as MX power domain 105 is powered-on before CX power domain 110. But it is difficult for all designs to always satisfy such a rigid power-on sequencing. It thus may be the case for certain implementations that CX power domain 110 is instead the first power domain to power on. But since MX power domain 105 is not powered during the power-up of CX power domain 110, the output of NOR gate 125 is unknown such that the output of level-shifter 145 is also unknown. It may be thus be the case that head switch transistor P3 is on while CX power domain 110 is being powered on. But note that CX peripheral logic domain 160 will include numerous level shifters (not illustrated) to level shift the various signals it receives from MX peripheral logic 120. Since the inputs to these level-shifters is unknown, their output signals are also unknown such that a substantial portion of these level-shifter output signals may be charged high to the core power supply voltage VDDCX and thus switch on internal CX-domain switches (not illustrated) such that a substantial power drain occurs during start-up of dual-power memory 100.

There is thus a need in the art for dual-power memories having flexible power-on sequencing with reduced power consumption.

SUMMARY

A dual-power SRAM includes a memory (MX) power domain and a core (CX) power domain. The MX power domain is powered by a memory power supply voltage whereas the CX power domain is powered by a core power supply voltage. These dual power domains may be powered up or down in whatever order is desired. To provide such an advantageous power sequencing, the dual-power memory includes a sequencing controller that asserts an MX clamp signal while the MX power domain is being powered up (or powered down). Similarly, the sequencing controller asserts a CX clamp signal while the CX power domain is being powered up (or powered down). The dual-power supply memory includes logic circuitry that is configured to respond to the assertion of either the MX clamp signal or the CX clamp signal by isolating peripheral logic in the MX domain and peripheral logic in the CX domain from their respective power supply rails.

These and other advantageous features may be better appreciated through the following detailed description.

BRIEF DESCRIPTION OF THE DRAWINGS

Embodiments of the present disclosure and their advantages are best understood by referring to the detailed description that follows. It should be appreciated that like reference numerals are used to identify like elements illustrated in one or more of the figures.

DETAILED DESCRIPTION

Figure 1:
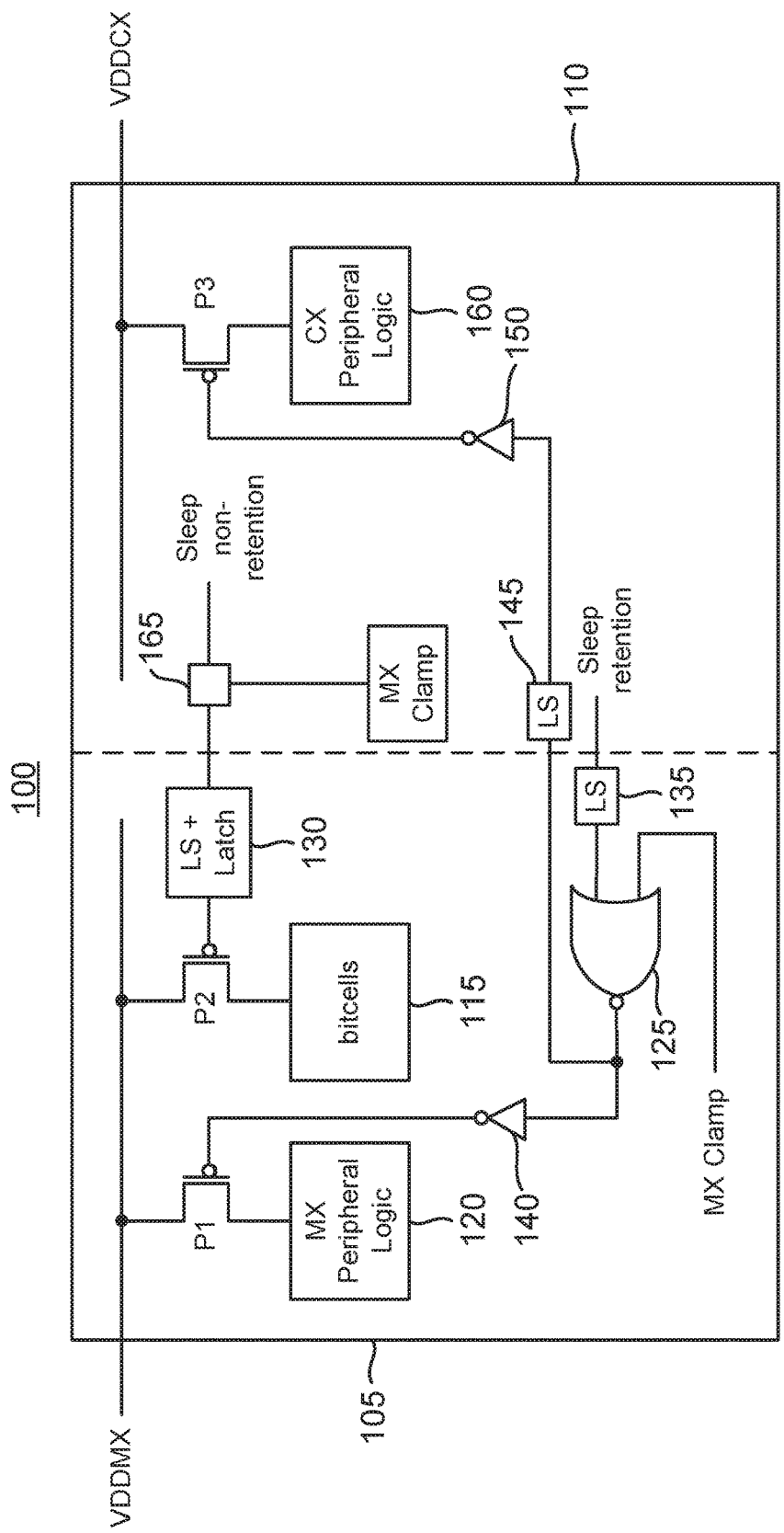
FIG. 1 is a diagram of a conventional dual-power memory.
Figure 2:
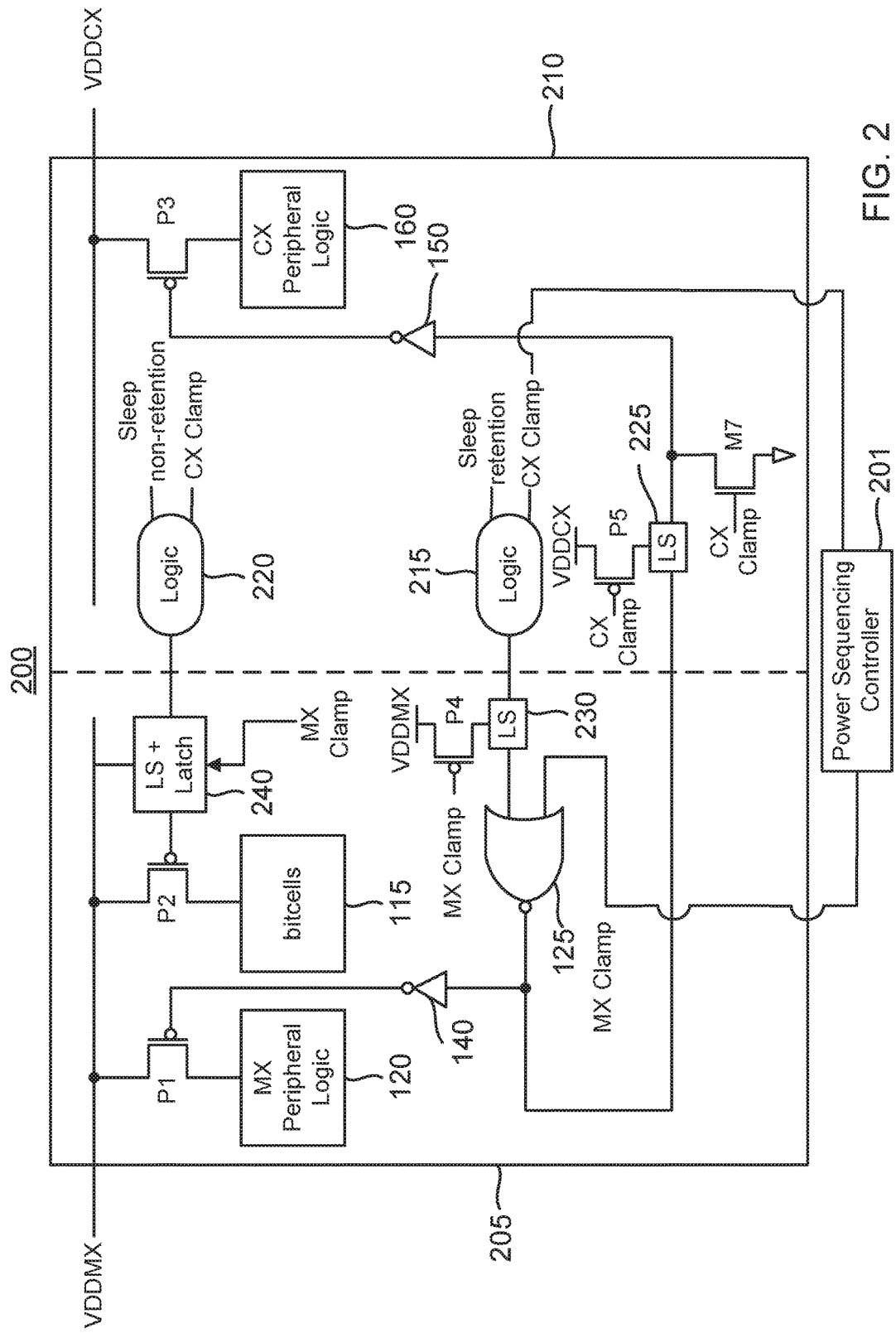
FIG. 2 is a diagram of a dual-power memory having a flexible power-on and power-off sequence in accordance with an aspect of the disclosure.

A dual-power supply memory is disclosed in which the power domains may be powered up or down in whatever order is desired. An example dual-power memory 200 configured for such flexible power sequencing is shown in FIG. 2. Dual-power memory 200 includes a memory (MX) power domain 205 and a core (CX) power domain 210. A memory power supply voltage VDDMX powers MX power domain 205 whereas a core power supply voltage VDDCX powers CX power domain 210. Dual-power memory 200 shares a number of features with dual-power memory 100 described earlier. For example, MX power domain 105 includes the plurality of bitcells 115 and also MX peripheral logic 120 whereas CX power domain 110 includes CX peripheral logic 160. In addition, MX peripheral logic 120 connects to an MX power rail for the memory power supply voltage VDDMX through PMOS head switch transistor P1 (it will be appreciated that the head switch transistors disclosed herein may comprise a plurality of head switch transistors arranged in parallel). Similarly, CX peripheral logic 160 connects to the CX power rail for the core power supply voltage VDDCX through PMOS head switch transistor P3 whereas bitcells 115 couple to the MX power rail through PMOS head switch transistor P2.

A power sequencing controller 201 controls the power-on and power-off sequencing of the MX and CX power domains 205 and 210 such that either power domain may be sequenced on or off prior to the other in whatever order is desired for a particular implementation. In particular, controller 201 asserts an MX clamp signal while MX power domain 205 is being powered on or off. Similarly, controller 201 asserts a CX clamp signal while CX power domain 210 is powered on or off. These signals are designated as "clamp" signals because dual-power memory is configured to respond to the assertion of these clamp signals by switching off head switch transistors P1 and P3 to isolate MX peripheral logic 120 and CX peripheral logic 160 from their respective power rails. As discussed with regard to dual-power memory 100, these peripheral logic circuits include the various peripheral components necessary for the operation of dual-power memory 200 such as row and column address decoders, clocks, write drivers, and sense amplifiers. In a static random access memory (SRAM) embodiment, each bitcell 115 comprises a pair of cross-coupled inverters. It will be assumed in the following discussion that dual-power memory 200 is a dual-power SRAM although it will be appreciated that the techniques and circuits disclosed herein are applicable to any suitable type of memory such as dynamic random access memories (DRAMs).

To conserve power, dual-power memory 200 is configured to implement a sleep mode with retention and also a sleep mode with non-retention. During the sleep mode with retention, head switch transistors P1 and P3 are switched off to isolate MX peripheral logic 120 and CX peripheral logic 160 from their power rails. But head switch transistors P1 and P3 should also be switched off in response to an assertion of the MX clamp signal or an assertion of the CX clamp signal. As used herein, a signal is said to be "asserted" when it is charged to the power supply voltage for its power domain. Since the MX clamp signal is an MX power domain signal, the MX clamp signal is deemed to be asserted by being charged to the memory power supply voltage VDDX. Similarly, the CX clamp signal is deemed to be asserted by being charged to the core power supply voltage VDDCX since the CX clamp signal is a CX power domain signal.

To configure dual-power memory 200 so that head switch transistors P1 and P3 are switched during the sleep mode with retention and also while either of the MX and CX clamp signals are asserted, dual-power memory 200 includes a logic circuit 215 that asserts an logic output signal in response to an assertion of either a sleep retention signal or the CX clamp signal. The sleep retention signal is a CX power domain signal that is asserted during the sleep retention mode. As discussed with regard to dual-power memory 100, bitcells 115 retain their contents during the sleep retention mode. However, MX peripheral logic 120 and CX peripheral logic circuit 160 are shut down during the sleep retention mode since these circuits are isolated from their respective power rails by the opening of head switch transistors P1 and P3. In this fashion, dual-power memory conserves power by cutting off leakage from MX peripheral logic circuit 120 and CX peripheral logic circuit 160 to save power during the sleep retention mode.

The logic output signal from logic circuit 215 is level shifted (if asserted) from the core power supply voltage VDDCX to the memory power supply voltage VDDMX by an MX-to-CX level-shifter (LS) 230 in MX power domain 205. Note that level-shifter 230 may be a differential level-shifter that level shifts with regard to an input signal and a complement of the input signal. An embodiment of logic circuit 215 that produces a corresponding output signal and a complement of the output signal will be discussed further herein for such differential level-shifting. Since MX power domain 205 may be powered up prior to CX power domain 210, the input to level-shifter 230 would be unknown in such a case. Thus, level-shifter 230 connects to the MX power rail through a PMOS head switch transistor P4. The MX clamp signal drives a gate of head switch transistor P4 such that head switch transistor P4 shuts off in response to an assertion of the MX clamp signal. Level-shifter 230 is thus cutoff from the memory power supply voltage VDDMX while the MX clamp signal is asserted. A NOR gate 125 processes a level-shifted output signal from level-shifter 230 with the MX clamp signal. The output of NOR gate 125 is discharged to ground in response to an assertion of either of its input signals. The output of NOR gate 125 will thus be discharged to ground in response to an assertion the sleep retention signal, or an assertion of the MX clamp signal, or an assertion the CX clamp signal.

The output of NOR gate 125 is level-shifted through an MX-to-CX level-shifter 225. In turn, a level-shifted output signal from level-shifter 225 is inverted by inverter 150 to drive a gate of head switch transistor P3. It will be appreciated that level-shifter 225 may be configured to respond to a true and false pair of input signals in a differential embodiment. In such embodiments, level-shifter 225 would process the output of NOR gate 125 and a complement of the output of NOR gate 125 to produce its level-shifted output signal. Note that CX power domain 210 may be powered on before MX power domain 205. In such a case, the output of NOR gate 125 would be unknown. Thus, level-shifter 225 connects to the CX power rail through a PMOS head switch transistor P5. The CX clamp signal drives a gate of head switch transistor P5 so that head switch transistor P5 is switched off while the CX clamp signal is asserted. To assure that head switch transistor P3 is switched off while the CX clamp signal is asserted, the output of level-shifter 225 is coupled to ground through an n-type meal-oxide semiconductor (NMOS) switch or ground transistor M7. The CX clamp signal drives a gate of switch transistor M7 so that the input to inverter 150 is grounded while the CX clamp signal is asserted. In this fashion, head switch transistor P3 is assured to be off while the CX clamp signal is asserted. In one embodiment, logic circuit 215, level-shifter 230, NOR gate 125, and level shifter 225 are deemed to form a means for switching off a first head switch (transistor P1) and a second head switch (transistor P2) responsive to the assertion of the CX clamp signal or MX clamp signal and for switching on the first head switch and the second head switch responsive to a de-assertion of the MX clamp signal and the CX clamp signal.

Figure 3:
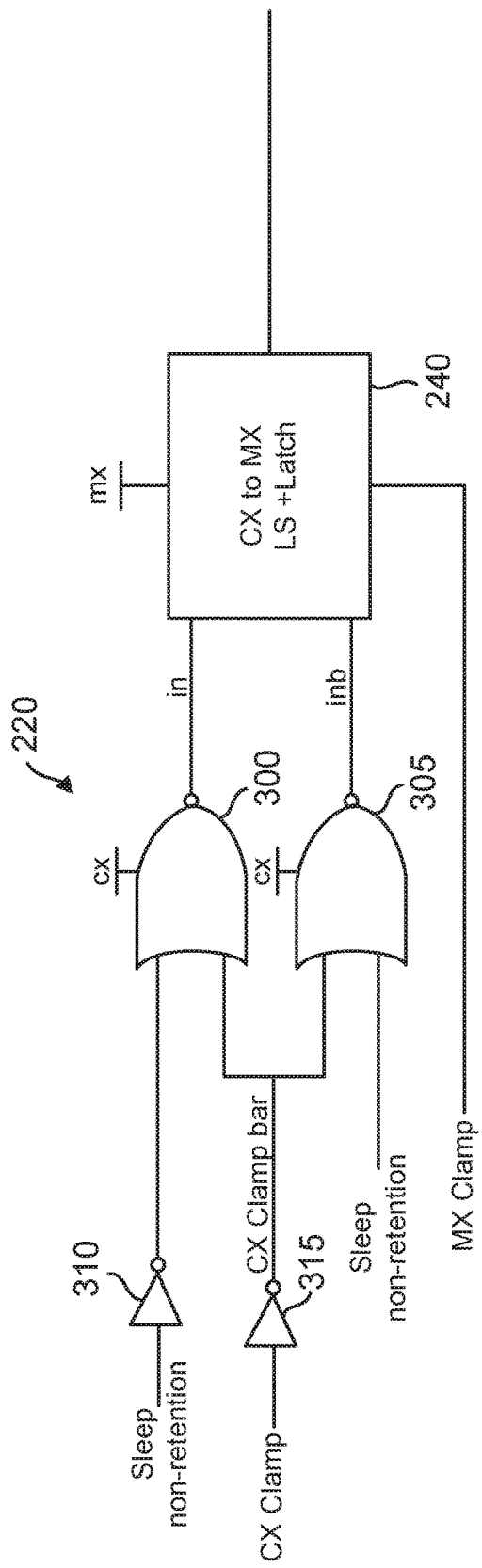
FIG. 3 is a diagram of a first level-shifter and latch and associated logic in the dual-power memory of FIG. 2.

During a sleep mode without retention, head switch transistor P2 is switched off to isolate bitcells 115 from the MX power rail. A CX-domain control signal designated as a sleep non-retention signal is asserted while the sleep mode without retention is active. But during the assertion of either the MX clamp signal or the CX clamp signal, whatever the current state (open or closed) of head switch transistor P2 should be maintained such that head switch transistor P2 does not respond to any changes in the sleep non-retention signal while either one of the clamp signals is asserted. To control head switch transistor P2, a logic circuit 220 processes the sleep non-retention signal and the CX clamp signal to drive a CX-to-MX level-shifter and latch 240 that also responds to the MX clamp signal. In some embodiments, CX-to-MX level-shifter and latch 240 may respond to both a true input signal (in) and a false or complement input signal (inb) as shown in FIG. 3. A CX-domain NOR gate 300 and a CX-domain NOR gate 305 form logic circuit 220. The CX clamp signal is received as an input signal to both of NOR gates 300 and 305. NOR gate 305 also receives the sleep non-retention signal whereas NOR gate 300 receives a complement of the sleep non-retention signal as inverted by an inverter 310. The output of NOR gate 300 forms the in input signal for CX-to-MX level-shifter and latch 240 whereas the output of NOR gate 305 forms the inb input signal.

As will be explained further herein, the latching function in CX-to-MX level-shifter and latch 240 is configured to be transparent if the in and inb input signals are complementary to each other and both the clamp signals are de-asserted (discharged to ground). In the transparent state, the in input signal to CX-to-MX level-shifter and latch 240 flows through to form a level-shifted output of CX-to-MX level shifter and latch 240. In the closed state, CX-to-MX level shifter and latch 240 does not respond to the input signals but instead maintains its output signal in whatever state it has been in prior to entering the closed state. Should both the CX clamp signal and the MX clamp signal be de-asserted (discharged to ground) and the sleep non-retention signal be asserted, the in input signal will be asserted whereas the inb input signal will be discharged. The latching function will thus be transparent such that the output signal of CX-to-MX level-shifter and latch 240 is asserted so as to shut off head switch transistor P3. If either of the clamp signals is then asserted, the latch function closes to maintain head switch transistor off. Conversely, if both clamp signals are de-asserted while the sleep non-retention signal is also de-asserted, the inb input signal will be asserted whereas the in input signal will be de-asserted. The latch function is again transparent such that the low state for the in input signal flows through to switch on head transistor P3. If either of the clamp signals is then asserted, the latch function closes to latch and maintain the de-asserted state of its output signal.

Figure 4:
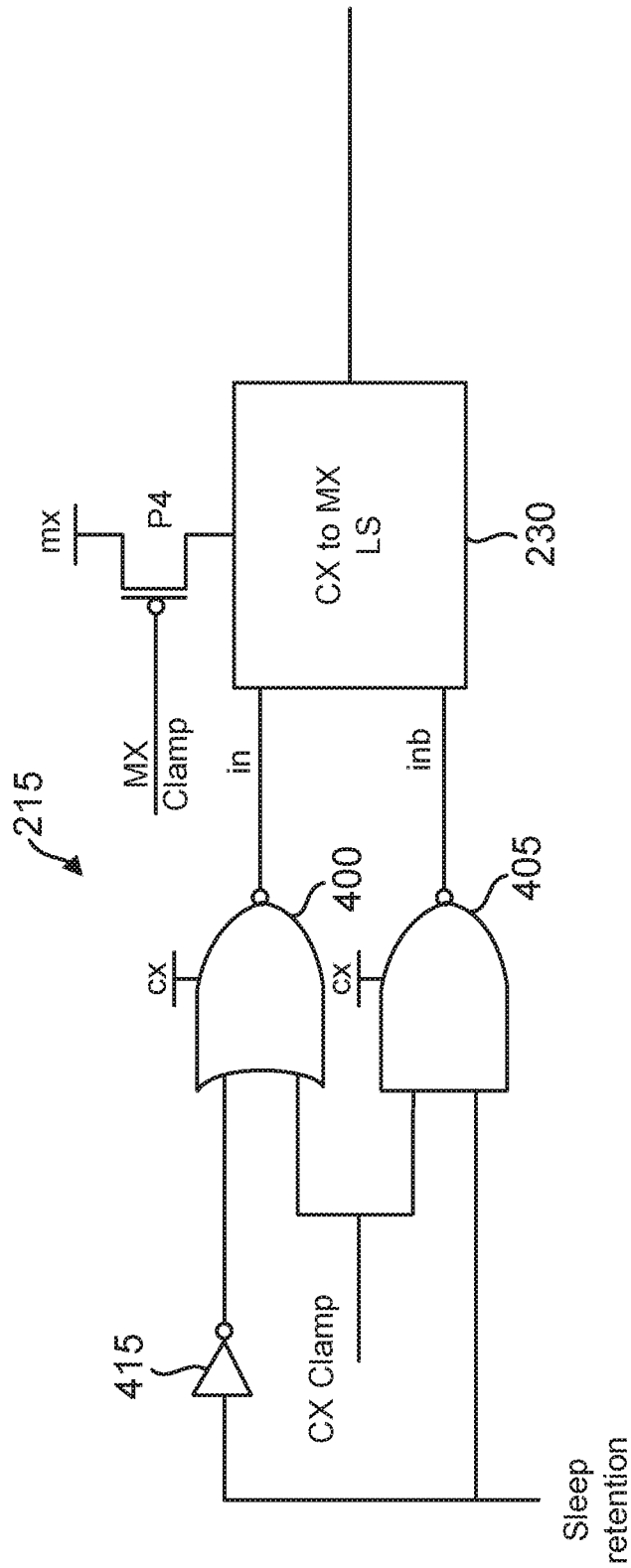
FIG. 4 is a diagram of a second level-shifter and associated logic in the dual-power memory of FIG. 2.

Logic circuit 215 is shown in more detail in FIG. 4 for an embodiment in which CX-to-MX level-shifter 230 processes both a true (in) input signal and a complement (inb) input signal. A NOR gate 400 produces the in input signal whereas a NOR gate 405 produces the inb input signal. Should the sleep retention signal be asserted while the CX clamp signal is de-asserted, NOR gate 400 will be processing two binary zero input signals such that the in input signal will be asserted. The assertion of the sleep retention signal causes the inb input signal to be de-asserted. Assuming that the MX clamp signal is also de-asserted, the output of CX-to-MX level-shifter 230 will thus be asserted high so that both head switch transistors P1 and P3 are switched off during the sleep retention mode. Conversely, if the sleep retention signal is de-asserted while the CX clamp signal is de-asserted, the inb input signal will be asserted whereas the in input signal will be de-asserted. Assuming that the MX clamp signal is also de-asserted to keep head switch transistor P4 on to power CX-to-MX level-shifter 230, the output of CX-to-MX level-shifter 230 is de-asserted. Both head switch transistors P1 and P3 will then be maintained on.

Figure 5:
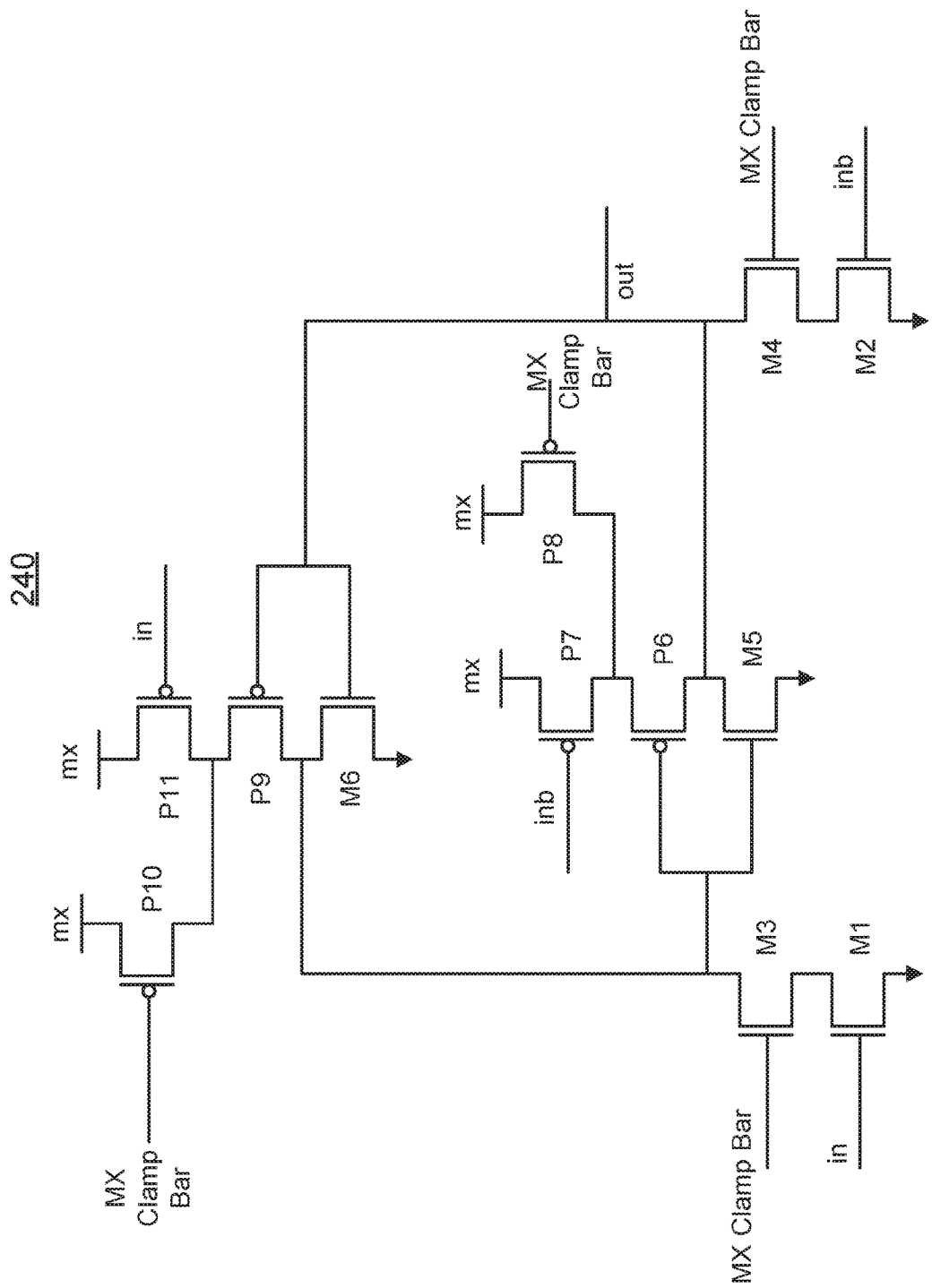
FIG. 5 is a circuit diagram of the level-shifter and latch of FIG. 3.

CX-to-MX level shifter and latch 240 of FIG. 3 is shown in more detail in FIG. 5. The in input signal drives a gate of an NMOS transistor M1 having a source connected to ground whereas the inb input signal drives a gate of an NMOS transistor M2 also having a source connected to ground. Should both the in and inb input signals be de-asserted, the latch function for CX-to-MX level-shifter and latch 240 is thus closed since neither input signal can affect the state of the latch. In the closed state, the latch is implemented by an inverter formed by an NMOS transistor M5 and a PMOS transistor P6 that is cross-coupled with another inverter formed by an NMOS transistor M6 and a PMOS transistor P9. The source of transistor M5 connects to ground whereas its drain connects to the drain of transistor P6. The source of transistor P6 couples to the MX power rail through a pair of PMOS transistors P7 and P8 arranged in parallel. The inb input signal drives the gate of transistor P7 whereas a complement of the MX clamp signal (MX clamp bar) drives the gate of transistor P8. Thus, if either the inb input signal or the MX clamp bar signal is de-asserted, the inverter formed by transistors P6 and M5 will be powered. The drains of transistors P6 and M5 form an output node for carrying the output signal from CX-to-MX level-shifter and latch 240.

To form the cross coupling between the inverters for the latch, the drains of transistors P6 and M5 connect to the gates of transistors P9 and M6. The source of transistor P9 couples to the MX power rail through a pair of PMOS transistors P10 and P11 arranged in parallel. The MX clamp bar signal drives the gate of transistor P10 whereas the in input signal drives the gate of transistor P11. Thus, if either the MX clamp bar signal or the in input signal is de-asserted, the inverter formed by transistors P9 and M6 is powered. The drains of transistors P9 and M6 connect to the gates of transistors P6 and M5 to complete the cross-coupling of the inverters.

Should the MX clamp signal be asserted, the latch function for CX-to-MX level-shifter and latch 240 should be closed. To keep MX level-shifter and latch 240 from responding to the in and inb input signal in that case, the drain of transistor M1 couples though an NMOS transistor M3 to the gates of transistors P6 and M5. Similarly, the drain of transistor M2 couples to the gates of transistors P9 and M6 through an NMOS transistor M4. The MX clamp bar signal drives the gates of transistors M3 and M4 so that the in and inb input signals cannot affect the state of the output signal when the MX clamp signal is asserted. The de-asserted state of the MX clamp bar signal switches on both transistors P11 and P8 such that both inverters are powered. In this fashion, whatever state the output signal was in prior to the assertion of the MX clamp signal is latched through the cross-coupling of the inverters. Should the MX clamp signal be de-asserted, both transistors M3 and M4 will be on so that MX level-shifter and latch 240 can respond to the in and inb input signals. The latch formed by the cross-coupled inverters will be transparent since one of the inverters is powered down depending upon the binary states for the in and inb input signals.

Figure 6:
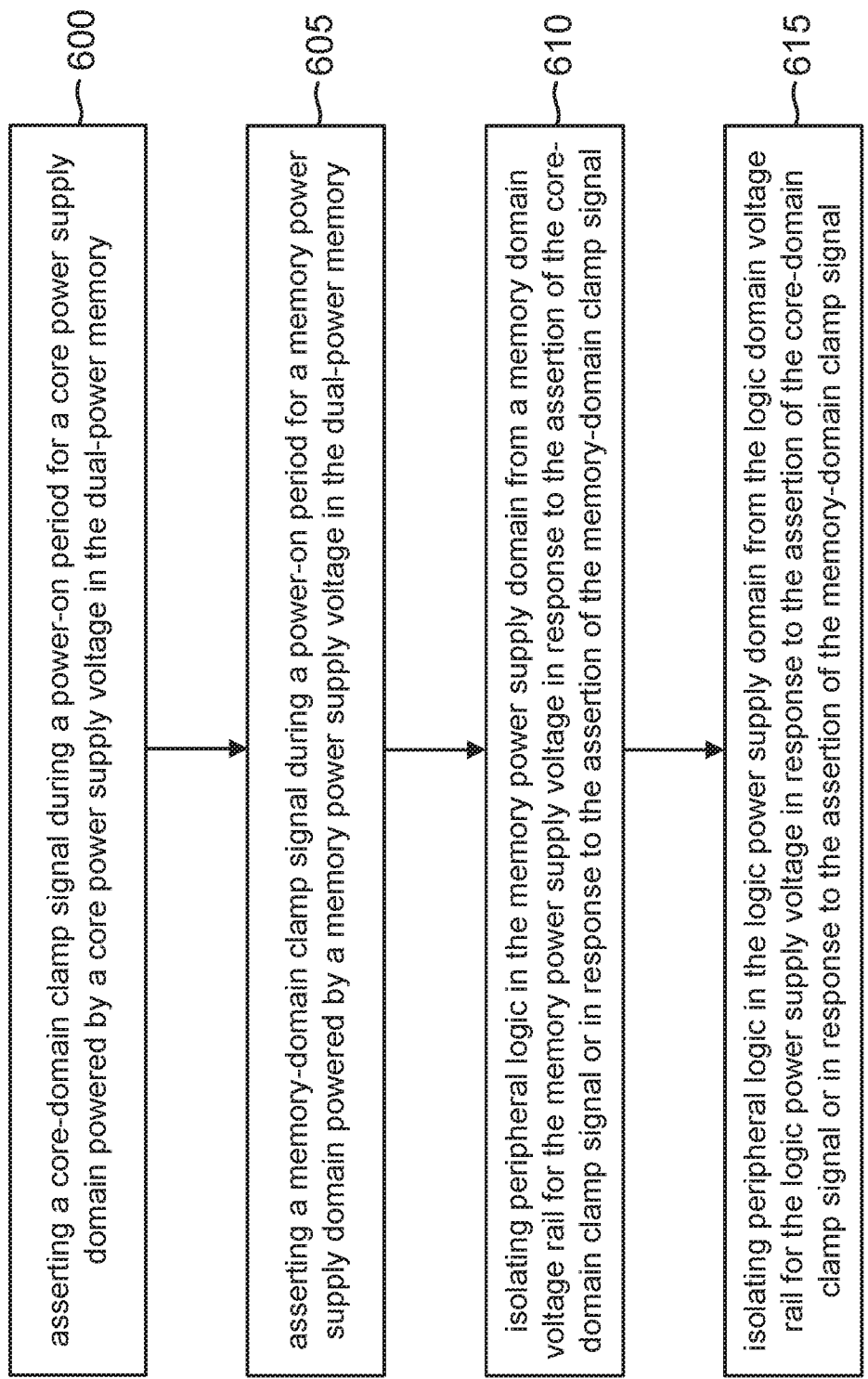
FIG. 6 is a flowchart for a power-on sequencing of a dual-power memory in accordance with an aspect of the disclosure.

A method of operation for a dual-power memory having a flexible power-on sequence will now be discussed with regard to the flowchart of FIG. 6. The method includes an act 600 of asserting a core-domain clamp signal during a power-on period for a core power supply domain powered by a core power supply voltage in the dual-power memory. The method includes an act 600 of asserting a core-domain clamp signal during a power-on period for a core power supply domain powered by a core power supply voltage in the dual-power memory. The assertion of the CX clamp signal as discussed with regard to dual-power memory 200 is an example of act 600. The method also includes an act 605 of asserting a memory-domain clamp signal during a power-on period for a memory power supply domain powered by a memory power supply voltage in the dual-power memory. The assertion of the MX clamp signal as discussed with regard to dual-power memory 200 is an example of act 605. Note that there is no order implied to acts 600 and 605—either one can occur before the other. The method further includes an act 610 of isolating peripheral logic in the memory power supply domain from a memory domain voltage rail for the memory power supply voltage in response to the assertion of the core-domain clamp signal or in response to the assertion of the memory-domain clamp signal. The switching off of head switch transistor P1 as discussed with regard to dual-power memory 200 is an example of act 610. Finally, the method includes an act 615 of isolating peripheral logic in the logic power supply domain from the logic domain voltage rail for the logic power supply voltage in response to the assertion of the core-domain clamp signal or in response to the assertion of the memory-domain clamp signal. The switching off of transistor P3 is an example of act 615. Regardless of which power domain is powered up first, the de-assertion of the memory-domain clamp signal and the core-domain clamp signal occurs after completion of the power-up sequence.

It will be appreciated that many modifications, substitutions and variations can be made in and to the materials, apparatus, configurations and methods of use of the devices of the present disclosure without departing from the scope thereof. In light of this, the scope of the present disclosure should not be limited to that of the particular embodiments illustrated and described herein, as they are merely by way of some examples thereof, but rather, should be fully commensurate with that of the claims appended hereafter and their functional equivalents.

We claim:

1. A dual-power supply memory, comprising:
a memory power domain including a memory power rail for a memory power supply voltage and including memory peripheral logic circuitry coupled to the memory power supply through a first head switch;
a core power domain including a core power rail for a core power supply voltage and including core peripheral logic circuitry coupled to the core power rail through a second head switch; and
a controller configured to assert a memory-domain clamp signal during a power-on period for the memory power domain and configured to assert a core-domain clamp signal during a power-on period for the core power domain, wherein the dual-power memory is configured to switch off the first head switch and the second head switch responsive to an assertion of the memory-domain clamp signal or an assertion of the core-domain clamp signal.

2. The dual-power supply memory of claim 1, further comprising:
a first level-shifter in the memory power domain configured to level-shift the core-domain clamp signal into a first level-shifted output signal;
a first logic gate in the memory power domain configured to process the first level-shifted output signal and the memory-domain clamp signal into a first logic output signal;
a second level-shifter in the core power domain configured to level-shift the first logic output signal into a second level-shifted output signal; and
an inverter in the core power domain configured to invert the second level-shifted output signal into a first inverted signal, wherein the second head switch is a first p-type metal-oxide semiconductor (PMOS) transistor having a gate configured to receive the first inverted signal.

3. The dual-power supply memory of claim 2, further comprising:
an inverter in the memory power domain configured to invert the first logic output signal into a second inverted signal, wherein the first head switch is a second PMOS transistor having a gate configured to receive the second inverted signal.

4. The dual-power supply memory of claim 2, further comprising:
a third head switch configured to couple the first level-shifter to the memory power rail, wherein the third head switch is configured to switch off in response to the assertion of the memory-domain clamp signal.

5. The dual-power supply memory of claim 2, further comprising a ground switch connected between an output node for the second level-shifter and ground, wherein the ground switch is configured to switch on in response to the assertion of the core-domain clamp signal.

6. The dual-power supply memory of claim 2, further comprising a sleep retention logic circuit in the core power domain configured to process the core-domain clamp signal with a sleep retention signal, wherein the first level-shifter is configured to level shift an output signal from the sleep retention logic circuit to produce the first level-shifted output signal.

7. The dual-power supply memory of claim 6, wherein the sleep retention logic circuit comprises a second logic gate and a third logic gate.

8. The dual-power supply memory of claim 7, wherein the second logic gate is a NOR gate configured to process the core-domain clamp signal and an inverted version of the sleep retention signal, and wherein the third logic gate is a NAND gate configured to process the sleep retention signal and the core-domain clamp signal.

9. The dual-power supply memory of claim 2, further comprising:
 a plurality of bitcells in the memory power domain;
 a third head switch configured to couple the plurality of bitcells to the memory power rail; and
 a third level-shifter configured to level-shift a sleep non-retention signal from the core power domain into a third level-shifted output signal, wherein the third head switch is configured to switch off responsive to an assertion of the third level-shifted output signal.

10. The dual-power supply memory of claim 9, wherein the third level-shifter further comprises a latch configured to latch the third level-shifted output signal responsive to the assertion of the core-domain clamp signal or the memory-domain clamp signal.

11. The dual-power supply memory of claim 9, further comprising:
 a non-retention logic circuit configured to process the core-domain clamp signal and the sleep non-retention signal to form a second logic output signal, wherein the third level-shifter is configured to level shift the second logic output signal to form the third level-shifted output signal.

12. The dual-power supply memory of claim 11, wherein the non-retention logic circuit comprises a second logic gate and a third logic gate.

13. The dual-power supply memory of claim 12, wherein the second logic gate is a first NOR gate configured to process the core-domain clamp signal and an inverted version of the sleep non-retention signal, and wherein the third logic gate is a second NOR gate configured to process the core-domain clamp signal and the sleep non-retention signal.

14. The dual-power supply memory of claim 1, wherein the dual-power supply memory comprises a dual-power supply static random access memory (SRAM).

15. A method for a dual-power supply memory, comprising:
 asserting a core-domain clamp signal during a power-on period for a core power supply domain powered by a core power supply voltage in the dual-power memory;
 asserting a memory-domain clamp signal during a power-on period for a memory power supply domain powered by a memory power supply voltage in the dual-power memory;
 isolating peripheral logic in the memory power supply domain from a memory domain voltage rail for the memory power supply voltage in response to the assertion of the core-domain clamp signal or in response to the assertion of the memory-domain clamp signal; and
 isolating peripheral logic in the core power supply domain from a core domain voltage rail for the core power supply voltage in response to the assertion of the core-domain clamp signal or in response to the assertion of the memory-domain clamp signal.

16. The method for the dual-power supply memory of claim 15, further comprising:
 isolating the peripheral logic in the memory power supply domain from the memory domain voltage rail responsive to an assertion of a sleep retention signal; and
 isolating the peripheral logic in the core power supply domain from the core domain voltage rail responsive to the assertion of the sleep retention signal.

17. A dual-power supply memory, comprising:
 a memory power domain including a memory power rail for a memory power supply voltage and including memory peripheral logic circuitry coupled to the memory power supply through a first head switch;
 a core power domain including a core power rail for a core power supply voltage and including core peripheral logic circuitry coupled to the core power rail through a second head switch;
 a controller configured to assert a memory-domain clamp signal during a power-on period for the memory power domain and configured to assert a core-domain clamp signal during a power-on period for the core power domain; and
 means for switching off the first head switch and the second head switch responsive to the assertion of the core-domain clamp signal or the memory-domain clamp signal and for switching on the first head switch and the second head switch responsive to a de-assertion of the core-domain clamp signal and the memory-domain clamp signal.

18. The dual-power supply memory of claim 17, further comprising:
 means for switching off the first head switch and the second head switch responsive to an assertion of a sleep retention signal from the core power domain.

19. The dual-power supply memory of claim 17, further comprising:
 a plurality of bitcells in the memory power domain;
 a third head switch configured to couple the plurality of bitcells to the memory power rail; and
 means for level-shifting a sleep non-retention signal from the core power domain into a switch control signal for the third head switch responsive to a de-assertion of the memory-domain clamp signal and the core-domain clamp signal and for latching the switch control signal responsive to the assertion of the memory-domain clamp signal or the assertion of the core-domain clamp signal.

20. The dual-power supply memory of claim 17, wherein the dual-power supply memory comprises a dual-power supply SRAM.

* * * * *

UNITED STATES PATENT AND TRADEMARK OFFICE
CERTIFICATE OF CORRECTION

| | | |
|---|---|---|
| PATENT NO. | : 10,446,196 B1 | Page 1 of 1 |
| APPLICATION NO. | : 16/164108 | |
| DATED | : October 15, 2019 | |
| INVENTOR(S) | : Mukund Narasimhan et al. | |

It is certified that error appears in the above-identified patent and that said Letters Patent is hereby corrected as shown below:

In the Specification

In Column 2, Line 4, reference number 135 should read 145.
In Column 2, Lines 9 and 25, reference number 130 should read 140 (both instances).

In the Claims

In Column 8, Claim 1, Line 5, delete "supply" and replace with -- rail --.
In Column 10, Claim 17, Line 5, delete "supply" and replace with -- rail --.

Signed and Sealed this
Fourteenth Day of April, 2020

Andrei Iancu
*Director of the United States Patent and Trademark Office*